(12) United States Patent
Dante

(10) Patent No.: US 7,043,511 B1
(45) Date of Patent: May 9, 2006

(54) PERFORMING CONDITIONAL OPERATIONS IN A PROGRAMMABLE LOGIC DEVICE

(75) Inventor: Conrad Dante, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 715 days.

(21) Appl. No.: 10/233,021

(22) Filed: Aug. 30, 2002

(51) Int. Cl.
*G06F 7/38* (2006.01)

(52) U.S. Cl. .................................... 708/230

(58) Field of Classification Search ......... 708/230–236
See application file for complete search history.

(56) References Cited

U.S. PATENT DOCUMENTS

| | | | |
|---|---|---|---|
| 4,642,487 A | 2/1987 | Carter | |
| 4,706,216 A | 11/1987 | Carter | |
| 4,758,985 A | 7/1988 | Carter | |
| 4,815,021 A * | 3/1989 | Steiner et al. | 708/233 |
| 5,754,459 A | 5/1998 | Telikepalli | |
| 5,964,825 A * | 10/1999 | Seshan et al. | 708/490 |
| 6,362,650 B1 | 3/2002 | New et al. | |
| 6,708,191 B1 * | 3/2004 | Chapman et al. | 708/235 |

OTHER PUBLICATIONS

U.A. Appl. No. 10/187,236, filed Jun. 28, 2002, Conrad Dante.
"CPU and Instruction Set", TMS320F/C24x DSP Controllers Reference Guide, Texas Instruments, pp. 4-1 to 4-20 (1999).
"Stratix: Programmable Logic Device Family," Altera Corporation, Aug. 2002, Ver. 2.1 Data Sheet.
"Silicon," Xilinx Products website, http://www.xilinx.c m/xlnx/xil_pr dc t_pr duct.jsp?title=silic n, printed Sep. 16, 2002, 3 pages.
Chameleon Systems—YOUR Communucation Platform; from website www.chameleonsystems.com, 5 pages.
"Tool suite supports reconfigurable processor" article by Richard Goering; published in *EE Times* on Aug. 14, 2001, 6 pages.
Xilinx Home; Virtex-II Pro Platform FPGAs; The Platform for Programmable Systems; from website www.xilinx.com, 3 pages.
Xilinx Home; PowerPC Embedded Processor Solution; from website www.xilinx.com, 2 pages.
Xilinx Home; The First Platform FPGA Solution; from website www.xilinx.com, 2 pages.

(Continued)

*Primary Examiner*—D. H. Malzahn

(57) ABSTRACT

A vector-domain engine configured to perform conditional operations on an operand vector in a programmable logic device is disclosed. The vector-domain engine may receive an instruction from and transmit an output vector to a programmable-logic-device domain. The output vector may be a first or second output vector depending on whether a comparison unit in the engine determines that a bit-field of the operand vector matches a designated pattern. The first output vector may be the operand vector modified by a function unit, and the second output vector may be the operand vector unmodified. A shifter may be employed to shift the bit-field to a desired position in the operand vector. The operand vector may comprise a pattern-defining portion and a data portion. The engine may also be configured to test a predetermined number of sequential operand vectors for the presence of the pattern.

34 Claims, 12 Drawing Sheets

OTHER PUBLICATIONS

Xilinx Home; Virtex-II Platform FPGA Features; from website www.xilinx.com, 3 pages.

QuickLogic Home; QuickRAM, Dual-Port Embedded RAM for Extremely High Performance Functions; from website www.quicklogic.com, 3 pages.

QuickLogic Home; QuickDSP, Embedded DSP Building Blocks for High-Performance, Complex DSP Designs; from website www.quicklogic.com, 2 pages.

QuickLogic Home; Eclipse, High Performance FPGAs with Enhanced Logic Supercell; from website www.quicklogic.com, 3 pages.

"Re-configurable High Speed Arithmetic Functions in a Non-Volatile FPGA", written by Rufino T. Olay III, Customer Engineer at QuickLogic, 6 pages.

High Performance Multipliers in QuickLogic FPGAs, written by John Birkner, Jim Jian and Kevin Smith of QuickLogic, 9 pages.

* cited by examiner

PERFORMING CONDITIONAL OPERATIONS IN A PROGRAMMABLE LOGIC DEVICE

FIELD

The present invention relates to programmable logic devices (PLDs) such as field-programmable gate arrays (FPGAs) and complex programmable logic devices (CPLDs). More particularly, the present invention relates to an engine for performing conditional operations on a vector operand in a PLD.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured or programmed (the terms are used interchangeably in the art) into a virtually unlimited number of specific logic functions. PLDs provide system designers with the ability to quickly create custom logic functions to provide product differentiation without sacrificing a rapid time to market. PLDs may be reprogrammable, meaning that the logic configuration can be reconfigured after the initial programming.

One type of PLD is known as a field-programmable gate array (FPGA). An FPGA is a general-purpose device that can be programmed by an end user to perform one or more selected functions. An FPGA typically includes an array of individually configurable logic blocks (CLBs), each of which is programmably interconnected to other CLBs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device (e.g., SRAM, EPROM, EEPROM, anti-fused, fused, etc.) is provided in the FPGA device so as to be at least once-programmable by device users for defining user-provided configuration instructions. Static Random Access Memory, or SRAM, is a form of reprogrammable memory that may be programmed differently many times. Electrically Erasable Programmable ROM, or EEPROM, is another example of nonvolatile reprogrammable memory. The configurable memory of an FPGA device may be formed of a mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations, or they may be configurable in accordance with user-provided configuration instructions.

(3) CLBs are provided for carrying out user-programmed logic functions (e.g., logic gates) as defined by user-provided configuration instructions. For instance, one or more CLBs may be configured to operate as a state machine. Typically, each of the many CLBs of an FPGA has at least one lookup table (LUT) that is user-configurable to define any desired truth table. A CLB may have other resources such as LUT input signal pre-processing resources and LUT output signal post-processing resources. Although the term "CLB" was adopted by early pioneers of FPGA technology, it is not uncommon to see other names being given to the repeated portion of the FPGA that carries out user-programmed logic functions. An example of another name often associated with a repeated portion of an FPGA is a Generic Logic Block (GLB).

(4) An interconnect network is provided for carrying signal traffic within the FPGA device between various CLBs and/or between various IOBs and/or between various IOBs and CLBs. At least part of the interconnect network is typically configurable so as to allow for programmably-defined routing of signals between various CLBs and/or IOBs in accordance with user-defined routing instructions.

Most FPGAs have these four features, but modern FPGAs tend to be even more complex. For example, many CLBs can be configured together to implement such devices as multipliers or complex microprocessors. For example, U.S. Pat. No. 5,754,459, issued May 19, 1998 to Telikepalli, teaches implementing a multiplier circuit using a number of CLBs in an FPGA architecture. However, implementing a multiplier using CLBs of an FPGA architecture may not only consume valuable CLB resources, but also consume valuable general interconnect resources, which in turn may slow performance of the FPGA device. Consequently, pre-configured, dedicated multipliers have been inserted into some FPGA designs in order to free valuable CLB resources for other functions, such as illustrated in U.S. Pat. No. 6,362,650 to New, et al.

SUMMARY

In order to further conserve valuable PLD resources, it is desirable to insert into the PLD domain preconfigured, dedicated vector components that perform designated vector-based logic operations. One type of vector-domain component is called a vector-domain engine. A vector-domain engine is disclosed that is configured to perform conditional operations on an operand vector in a PLD.

In one aspect, the vector-domain engine is coupled to a PLD domain via an interface. Components in the PLD domain may be configured to transmit an instruction, which comprises an operand vector and an opcode vector, through the interface to the vector-domain engine. The vector-domain engine may receive an instruction from other sources as well, such as from sources within the vector domain. The vector-domain engine outputs either a first or second output vector depending on whether a bit-field, which comprises one or more contiguous bits of the operand vector, matches a designated pattern. The output vector from the vector-domain engine may be routed back to the PLD domain or to other vector-domain components. Additionally, the conditional operation may be performed in a single instruction.

In another aspect, a comparison unit is used to determine whether the bit-field of the operand vector matches a designated pattern. Additionally, the first output vector may be the operand vector modified by a function unit. Correspondingly, the second output vector may be the original operand vector or the operand vector modified by a different function unit.

In another aspect, a shifter is used to shift the bit-field of the operand vector to a desired position in the operand vector so that it is aligned with the comparison unit. Portions of the opcode vector may then instruct the vector-domain engine as to the location and size of the bit-field within the operand vector.

In another aspect, the operand vector includes a pattern-defining portion and a data portion. The pattern-defining portion is used to define the pattern for which the bit-field is tested. The pattern-defining portion may be loaded into the vector-domain engine simultaneously with the data portion.

In another aspect, the vector-domain engine is configured to test a series of operand vectors for the presence of a pattern and to perform an operation based on whether a match is found in each operand vector in the series.

These and other aspects of the disclosed technology will become apparent from the following detailed description, which references the accompanying drawings.

DETAILED DESCRIPTION

Figure 1:
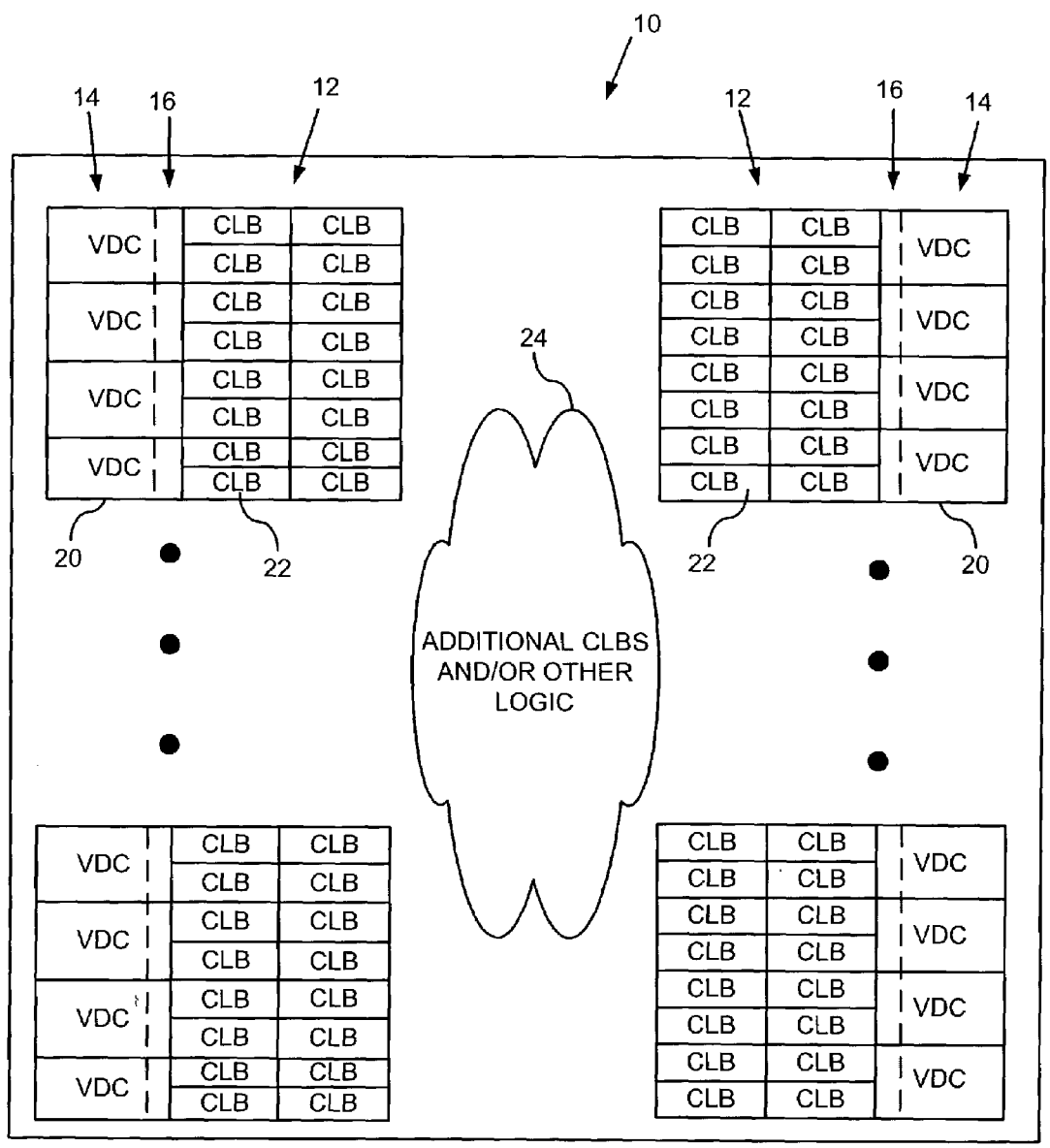
FIG. 1 schematically shows a programmable logic device that includes vector-domain components and CLBs.

FIG. 1 shows schematically a programmable logic device (PLD) 10 that includes a PLD domain, shown generally at 12, and a vector domain, shown generally at 14. The PLD 10 may be, for example, an FPGA. The two domains are coupled through interfaces 16. PLD domain 12 may include conventional fine-grain logic, memory, and routing resources where signals are switched and routed on a bit-by-bit basis. Such bit-by-bit manipulation is termed unordered because the bits are not arranged in a predetermined order throughout the domain. Vector domain 14 may include one or more columns of vector-domain components 20 (VDCs) that are configured to perform operations on digital vectors. Digital vectors, or words, comprise multiple bits grouped together into a single unit (e.g., sixteen-bit, thirty-two-bit, sixty-four-bit vectors, etc.). For example, VDCs 20 could be configured to process a thirty-two-bit input vector and produce a thirty-two-bit output vector. VDCs 20 may comprise individual vector-domain engines or may comprise vector-processing blocks (VPBs) that have multiple, embedded vector-domain engines. The groups of wires in vector domain 14 are routed so as to carry one vector signal so that all bits in a vector are controlled and switched at once. Interfaces 16 convert selected unordered bits from the PLD domain 12 to vectors used in the vector domain 14. In FIG. 1, PLD domain 12 has multiple columns of configurable logic blocks 22 (CLBs). The number of CLBs 22 varies with the particular design. As shown at logic 24, additional CLBs 22 and/or other logic may also exist within the PLD. For example, other devices (e.g., memories, multipliers, etc.) may be included in logic 24.

Figure 2:
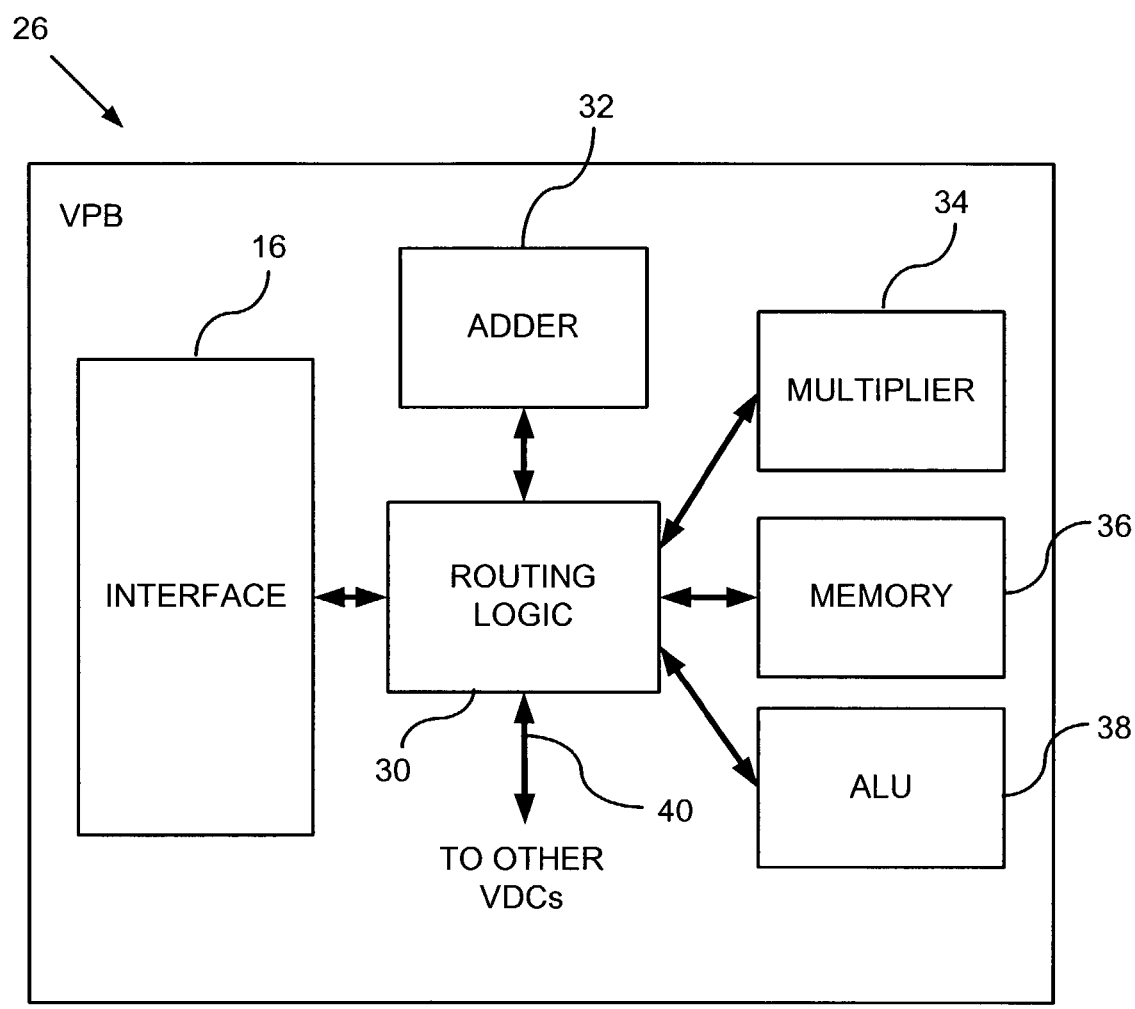
FIG. 2 schematically shows a type of vector-domain component called a vector-processing block.

FIG. 2 shows schematically a type of VDC, known as a VPB, in greater detail. The particular VPB shown is not a general-purpose processor. It is an application-specific embedded processor that requires a relatively small program store and only communicates with dedicated internal resources. The embedded processor is not built from combinations of programmable logic blocks. Instead, it is made from logic that is designed for specific classes of functions (e.g., multiply, add, etc.). Because the embedded processor is designed for a specific set of functions, it is built to perform these functions in a highly efficient manner through the use of specialized logic and parallel processing. By contrast, general processors use generalized logic resources and require large program stores and flexible interfaces to support a wide range of peripheral devices, such as keyboards, disk drives, printers, and scanners.

In FIG. 2, VPB 26 has an interface 16, but it is understood that the interface may be located externally to the VPB. The interface 16 facilitates communication with the PLD domain 12. Routing logic 30 is coupled to interface 16 and facilitates routing to various components (e.g., engines) within the VPB 26. VPB 26 may also be connected to other VDCs through routing 40. VPB 26 may include one or more vector-domain engines. The vector-domain engines may comprise: adders (e.g., adder 32), multipliers (e.g., multiplier 34), memory (e.g., memory 36) or ALUs (e.g., ALU 38). ALU 38 may be a vector-domain engine configured to perform conditional operations on an operand vector according to the principles discussed below.

Figure 3:
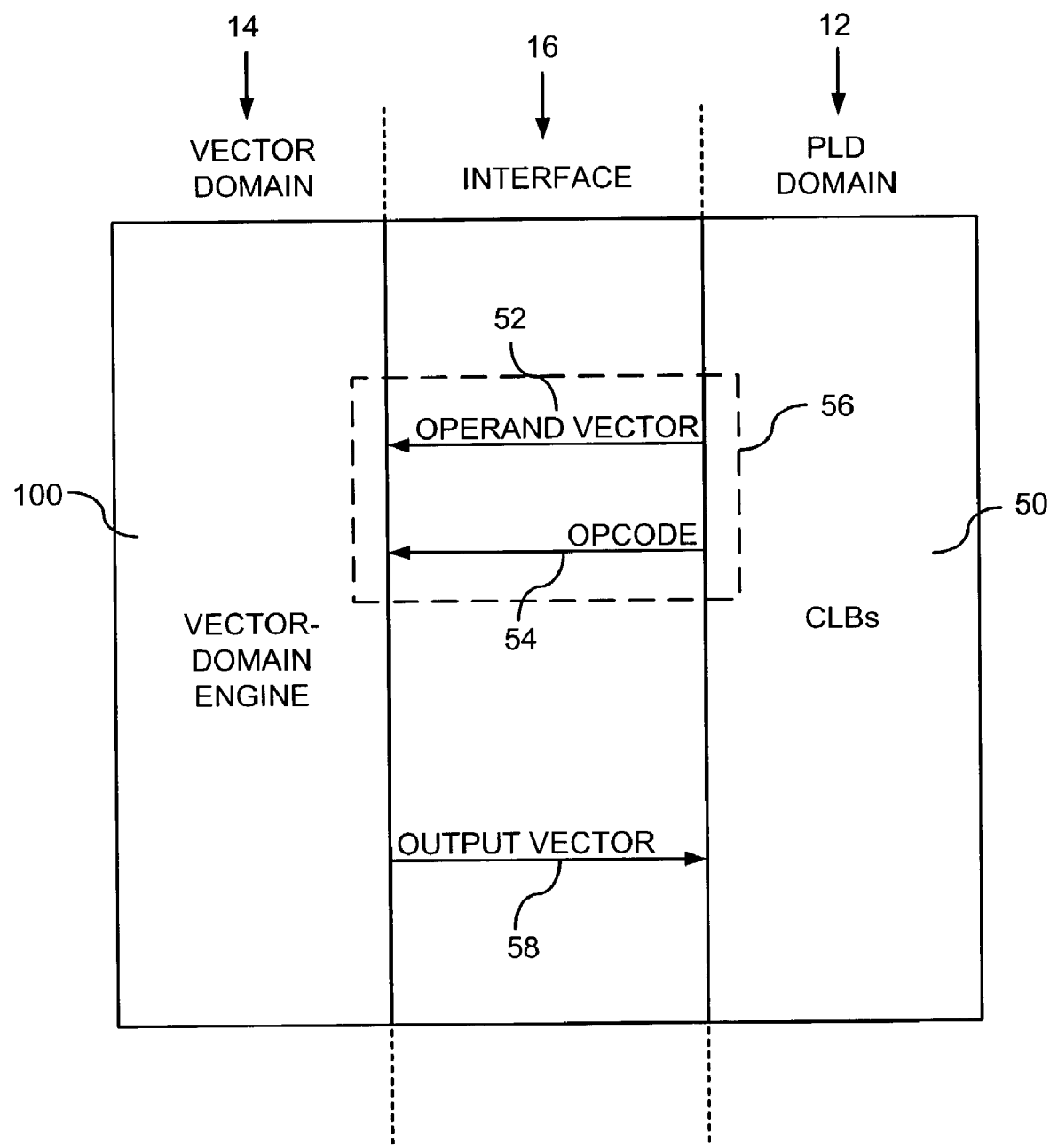
FIG. 3 schematically illustrates how an exemplary vector-domain engine configured to perform conditional operations interacts with the PLD domain to perform such operations.

FIG. 3 illustrates schematically how an exemplary vector-domain engine configured to perform conditional operations on an operand vector might interact with the PLD domain to perform the conditional operations. It is understood that the vector-domain engine may: (1) be embedded in a VPB, as discussed above; (2) stand alone, as illustrated; or (3) be embedded in another vector-domain component. In FIG. 3, PLD domain 12 comprises multiple CLBs 50, which may be configured, for instance, as a state machine. An instruction 56 from the PLD domain 12 is sent to a vector-domain engine 100 in the vector domain 14 via interface 16. It is understood, however, that instruction 56 might originate from a source within the vector domain as well. Instruction 56 includes a set of data bits that are converted by interface 16 into an operand vector 52 and a set of control bits that are converted into an opcode vector 54. Operand vector 52 constitutes the data on which vector-domain engine 100 operates. Opcode vector 54, on the other hand, constitutes the bits that control the operation performed by vector-domain engine 100. Operand vector 52 and opcode vector 54 may be received and processed in parallel by vector-domain engine 100. Vector-domain engine 100 may be configured to perform the conditional operation after receiving a single instruction 56. Upon receiving instruction 56, vector-domain engine 100 performs a conditional operation on operand vector 52 and produces an output vector 58. The operation performed is conditional on whether a field of bits, termed the "bit-field," in the operand vector 52 matches a designated pattern. The bit-field may comprise a single bit or a set of contiguous bits in operand vector 52. The pattern may similarly comprise a single bit or a set of contiguous bits. The pattern might also include one or more "don't care" bits whose values need not be matched to the corresponding bits of the bit-field. Vector-domain engine 100 outputs either a first output vector if the bit-field of the operand vector matches the pattern, or outputs a second output vector if the bit-field does not match the pattern. Output vector 58 may then be sent back to the PLD domain 12, as illustrated, or to other VDCs in the vector domain 14 (e.g., other VPBs) for additional processing.

FIGS. 4–12 illustrate representative embodiments of the vector-domain engine shown in FIG. 3. All the vector-domain engines described may receive instructions from the PLD domain, as illustrated in FIG. 3, or from other sources, such as an instruction memory in the vector domain or a controller in the vector domain.

Figure 4:
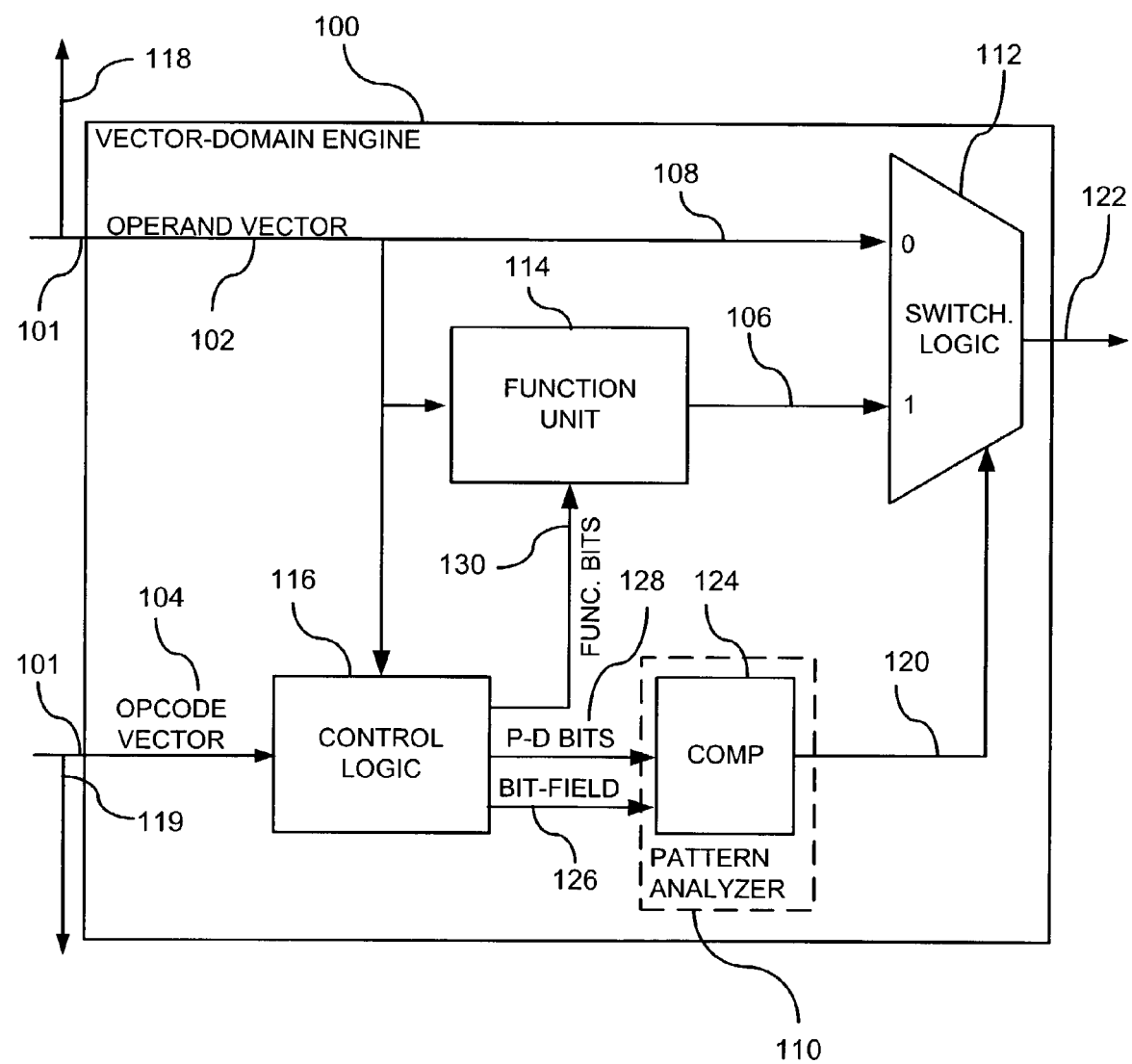
FIG. 4 shows a first representative embodiment of a vector-domain engine configured to perform conditional operations on an operand vector.

FIG. 4 shows a first representative embodiment of a vector-domain engine configured to perform conditional logical or arithmetic operations on an operand vector. Vector-domain engine 100 may be embedded in a VPB as part of the ALU engine or may be a separate VDC. In general, vector-domain engine 100 is configured to determine whether a pattern exists in a bit-field of the operand vector carried on path 102 using a pattern analyzer 110. In FIG. 4, pattern analyzer 110 controls switching logic 112 via a selection signal carried on path 120 so that the switching logic outputs a first output vector from path 106 if a pattern match is found and a second output vector from path 108 if a pattern match is not found. The first output vector comprises the operand vector modified by a function unit 114. The second output vector comprises the operand vector unmodified. The selection signal may also be configured to output the second output vector if a pattern match is found and the first output vector if a match is not found.

FIG. 4 shows specifically that vector-domain engine 100 receives from an external source the operand vector on path 102 and an opcode vector on path 104. Paths 102 and 104 are received at an input port 101. The operand vector on path 102 is routed to multiple areas of vector-domain engine 100. Specifically, the operand vector is routed to: (1) switching logic 112, thereby forming a second output vector on path 108; (2) function unit 114; and (3) control logic 116. The operand vector may also be routed by routing 118 to other engines in the vector domain that are configured to perform different operations on the operand vector using different opcode vectors. Similarly, the opcode vector may be routed by routing 119 to other engines in the vector domain that are configured to use the opcode vector on different operand vectors.

Function unit 114 is configured to input path 102 carrying the operand vector, perform a logical or arithmetic operation on the operand vector, and output a first output vector on path 106. Function unit 114 may comprise multiple processing units and be configured to perform various logical or arithmetic operations, such as absolute value, increment, decrement, round convergent, round up, invert, and negate. Additionally, function unit 114 may be configured to perform an extensive set of bit-field operations, as well as commands to support floating point operations. Function unit 114 may comprise, for example, one or more half-adders. The first output vector is routed from function unit 114 to switching logic 112 on path 106. Depending on the value of the selection signal carried on path 120, switching logic 112 outputs at output terminal 122 either the first output vector or the second output vector. Switching logic 112 may be, for example, a multiplexer having a single-bit selection input and two multiplexer inputs, each having a width corresponding to the widths of the first output vector and the second output vector. The particular ordering and composition of the output vectors shown in FIG. 4 is not limiting, and other configurations or orders of the output vectors are possible. For instance, the second output vector may be the modified vector from function unit 114 or may comprise the operand vector modified by another function unit (not shown). Additionally, the vector from output terminal 122 may be routed to other components in the engine 100, or, as is shown in FIG. 4, out of the engine 100. The vector from output terminal 122 may also be routed to other engines in the vector domain (e.g., other engines in the VPBs), to another VDC 20, or to the PLD domain 12.

The value of the selection signal on path 120 is controlled by pattern analyzer 110, which determines whether a pattern exists in the operand vector. Pattern analyzer 110 typically includes at least one comparison unit 124. Comparison unit 124 may be, for example, a look-up table (LUT). Comparison unit 124 is configured to compare a designated pattern with a bit-field of the operand vector carried on path 126 and to determine whether a match exists. Comparison unit 124 is further configured to output a single-bit selection signal on path 120 indicating whether a match exists. In FIG. 4, for example, the selection signal is "0" if no match is found and "1" if a match is found. Accordingly, the first output vector is output on output terminal 122 if a match is found, and the second output vector is output if a match is not found. Comparison unit 124 also has an input coupled with control logic 116.

Control logic 116 comprises various logic and routing components configured to receive the operand vector on path 102 and the opcode vector on path 104. Control logic 116 is configured to decode and route portions of the opcode vector that comprise control bits specific to the individual components of vector-domain engine 100. For instance, in FIG. 4, the opcode vector is decoded by control logic 116 into pattern-defining bits carried on path 128 and function-controlling bits carried on path 130. The pattern-defining bits instruct comparison unit 124 as to what pattern it is to search for in the bit-field of operand vector 102. The pattern-defining bits may be included as part of the opcode vector, as shown, preprogrammed within comparison unit 124, or input into comparison unit 124 through some other external means. The function-controlling bits instruct function unit 114 as to what operation it is to perform on the operand vector. Control logic 116 is further configured to input operand vector path 102 and route that portion of the operand vector corresponding to the bit-field to comparison unit 124 on path 126. For instance, the operand vector may be a sixteen-bit vector in which the last four bits are tested for the presence of a four-bit pattern. In that case, control logic 116 is configured to route only the last four bits to comparison unit 124 as the bit-field.

Figure 5:
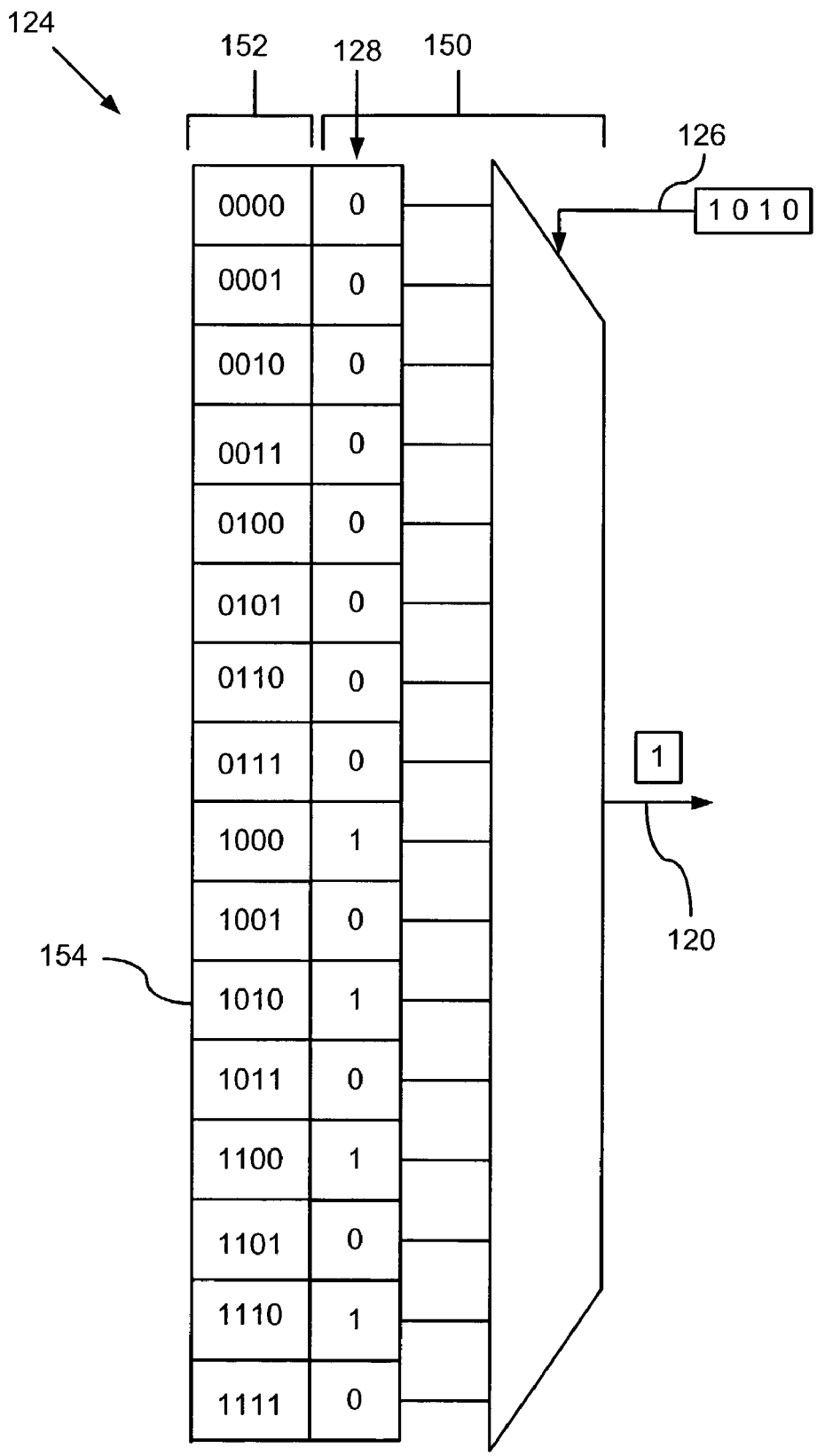
FIG. 5 schematically shows an exemplary comparison unit from the vector-domain engine of FIG. 4 used to perform conditional operations on an operand vector.

FIG. 5 shows schematically an exemplary comparison unit 124 as can be used in the vector-domain engine shown in FIG. 4. Comparison unit 124 may comprise a LUT, but could comprise other logic capable of testing for a pattern (e.g., a decoder coupled with memory). In general, the bit-field is input into comparison unit 124 on path 126 and checked for a pattern defined by pattern-defining bits 128. Each bit of pattern-defining bits 128 corresponds to a possible binary value of the bit-field. Thus, for example, if the bit-field is four-bits wide, sixteen pattern-defining bits 128 are required to test every possible binary value of the bit-field (i.e., $4^2=16$). Logic 150 is configured to determine the value of pattern-defining bits 128 for the specific binary value found in the bit-field. Logic 150 may comprise, for example, a multiplexer coupled with memory. Logic 150 outputs a single-bit selection signal on path 120 based on the value determined. Thus, logic 150 shown in FIG. 5 is configured to output from comparison unit 124 the value of the bit in pattern-defining bits 128 corresponding to the specific binary value found in the bit-field. It is understood, however, that other configurations are possible.

FIG. 5 also illustrates the operation of comparison unit 124 using a representative example. The exemplary bit-field, which contains four bits, is input into logic 150 on path 126. In order to consider all binary possibilities, sixteen pattern-defining bits 128 are also input into logic 150. The binary values corresponding to the sixteen pattern-defining bits 128 are shown schematically in column 152. In this example, the pattern defined by pattern-defining bits 128 determines whether the bit in position zero of bit-field 126 is low and whether the bit in position three is high. The bits in positions one and two are not considered and constitute "don't cares." Numerically represented, the pattern is "1XX0". Thus, as is seen by comparing the binary value in column 152 with the value of pattern-defining bits 128, if the bit in position zero is low and the bit in position three high (i.e., the binary values "1000," "1010," "1100," and "1110"), the corresponding bit in pattern-defining bits 128 is high. On the other hand, if the bit in position zero is high, or if the bit in position three is low, the corresponding bit is low. In this example, a match is found if the pattern-defining bit is high for the particular binary value of bit-field 126. In this case, bit-field 126 is equal to the binary value "1010." Thus, because the bit in position zero is low and the bit in position three is high, a bit 154 of pattern-defining bits 128 is high. Accordingly, a match is found and comparison unit 124 outputs a "1" as the value of selection signal 120.

Figure 6:
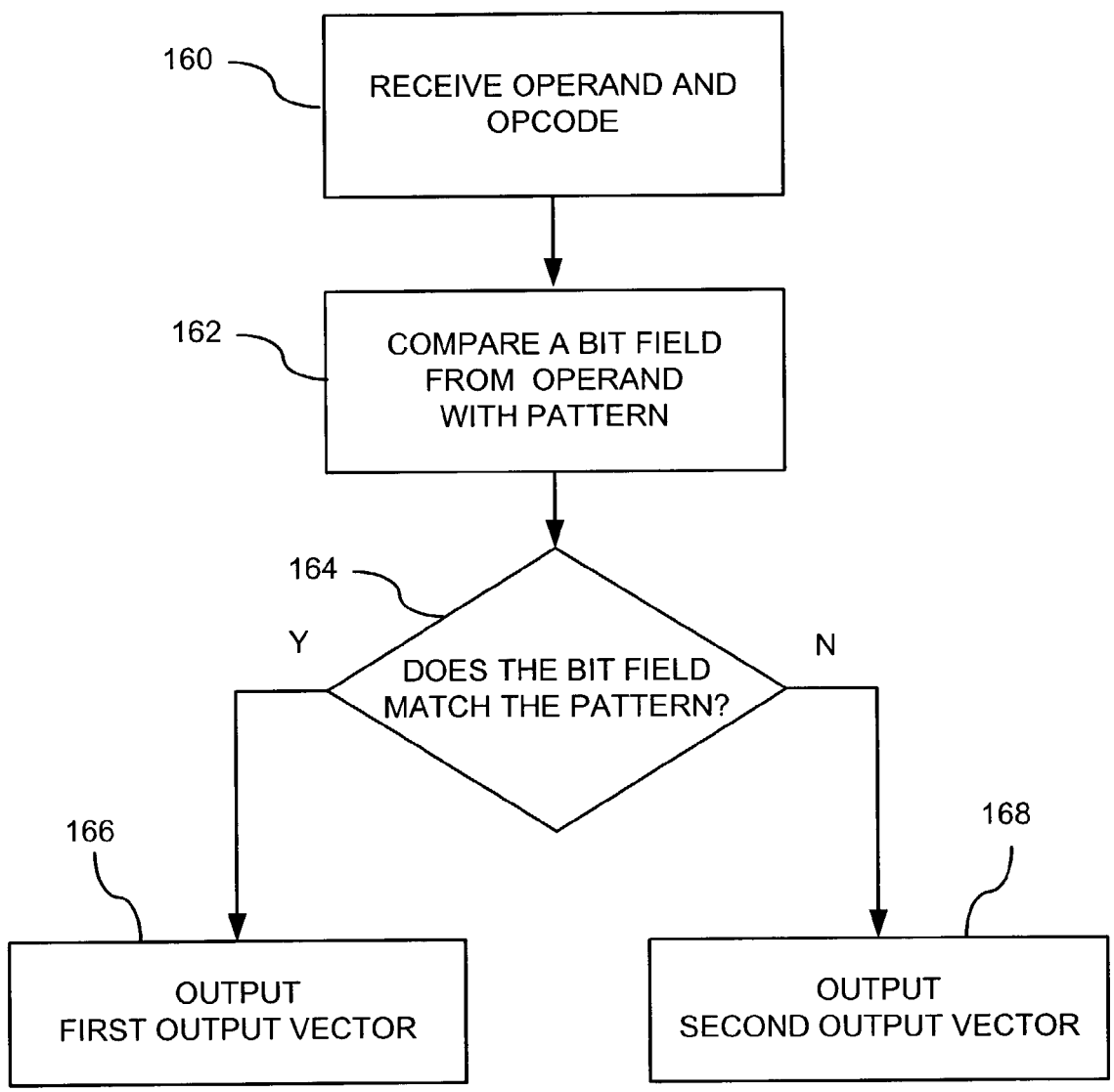
FIG. 6 shows a flowchart of a method for performing a conditional operation using the vector-domain engine of FIG. 4.

FIG. 6 shows a flowchart of a method for performing a conditional operation on an operand vector using the vector-domain engine of FIG. 4. In process block 160, an operand vector and an opcode vector are received. As discussed above, the operand and opcode combine to form a single instruction. This instruction may be transmitted from the PLD domain into the vector processing domain. Further, the vector-domain engine may be operated using only a single instruction. In process block 162, a bit-field of the operand vector is compared with a pattern. In process block 164, a determination is made as to whether the bit-field matches the pattern. If it is determined that the bit-field matches the pattern, a first output vector is output from the engine at process block 166. If it is determined that the bit-field does not match the pattern, a second output vector is output from the engine at process block 168. As described above, the first output vector may be equal to a modified vector resulting from a function unit performing a logical or arithmetic operation on the operand vector. Additionally, the second output vector may be equal to the operand vector, but may also be a modified vector resulting from a second function unit performing an operation on the operand vector. The output vector may be output from the vector-domain engine for further processing in the vector domain or may be transmitted back to the PLD domain.

Figure 7:
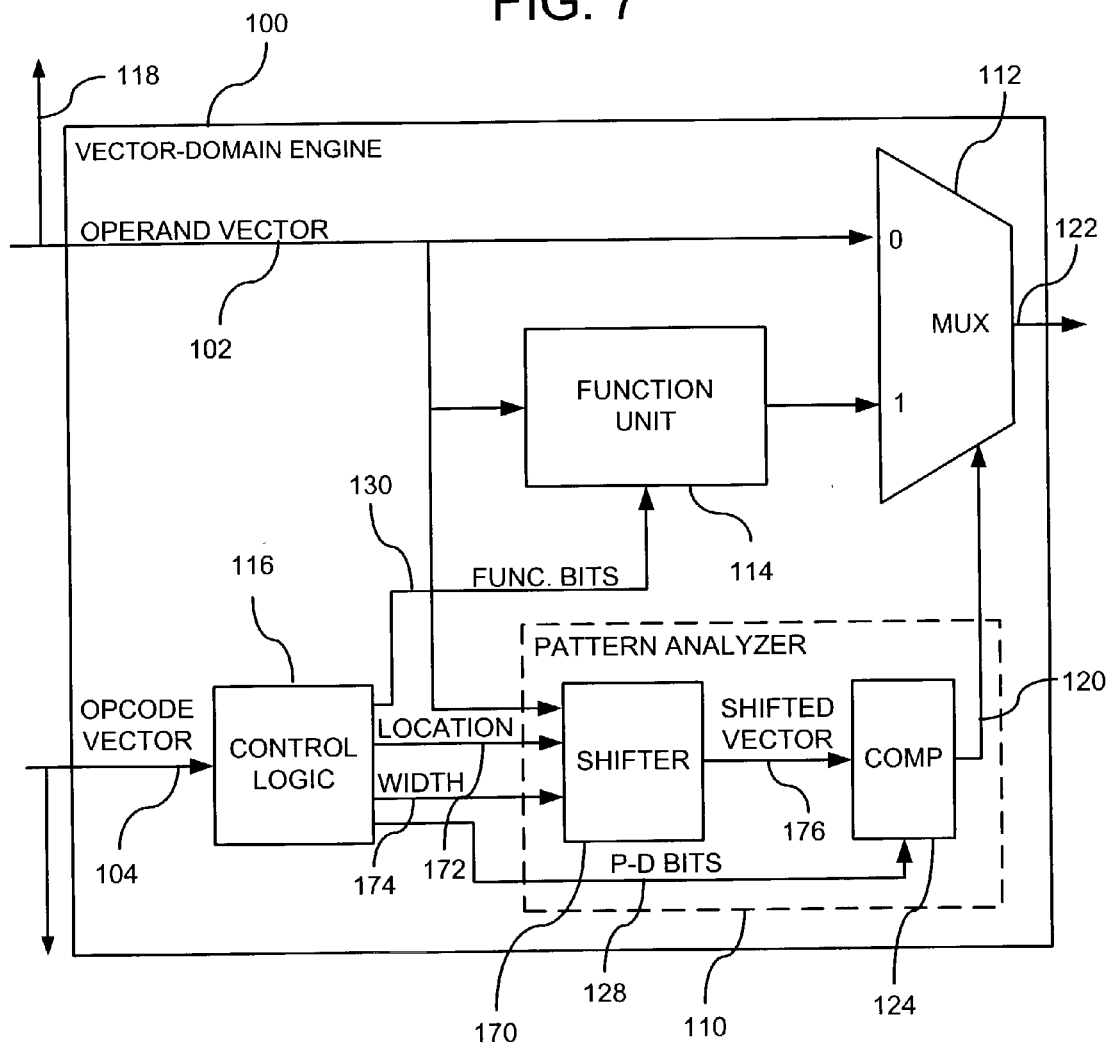
FIG. 7 shows a second representative embodiment of the vector-domain engine configured to perform conditional operations on an operand vector.

FIG. 7 shows a second representative embodiment of vector-domain engine 100. The second embodiment is similar to the other embodiments, except that pattern analyzer 110 includes a shifter 170, which is used to shift the bit-field to a designated position in the operand vector. Shifter 170 may comprise multiple shifters, such as a right barrel shifter and a left barrel shifter, and logic to control each shifter. In this embodiment, control logic 116 is configured to decode the opcode vector into bit-field-location bits carried on path 172 and bit-field-width bits carried on path 174. Additionally, shifter 170 is configured to receive the operand vector on path 102, bit-field-location bits on path 172, and bit-field-width bits on path 174. Based on the value of the bit-field-location bits, shifter 170 locates the beginning of the bit-field in the operand vector to be tested for the presence of the pattern. This location in the operand vector is termed the "marker bit." Based on the value of the bit-field-width bits, shifter 170 determines how many bits, beginning with the marker bit, are to be tested for the presence of the pattern. Thus, the bit-field-location bits and the bit-field-width bits are used together to determine what portion of the operand vector comprises the bit-field. It is understood, however, that comparison unit 124 might be configured to receive a fixed-width bit-field, in which case the bit-field-width bits are unnecessary. Shifter 170 is further configured to shift the bit-field so that it is located at a desired position in the operand vector and may be properly routed to comparison unit 124 in a shifted vector carried on path 176. The desired position may be such that the bit-field occupies the least significant bits in the operand vector. For instance, shifter 170 may shift a four-bit bit-field to positions zero through three in the shifted vector.

Figure 8:
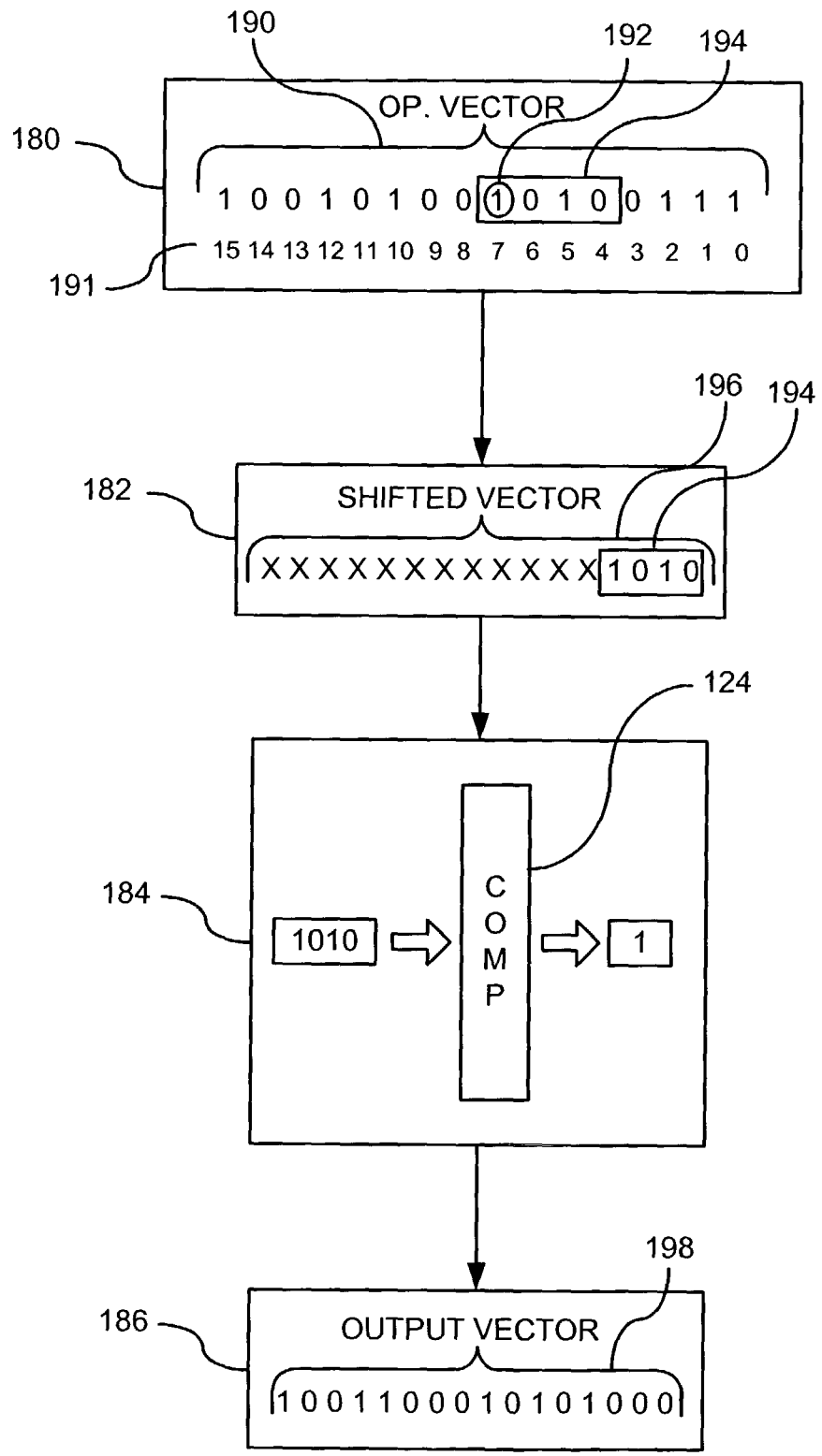
FIG. 8 illustrates the operation of the second representative embodiment shown in FIG. 7.

FIG. 8 illustrates the operation of the second representative embodiment shown in FIG. 7 using a representative example. The values used in this example are for illustration purposes only and are not intended to be limiting in any way. In block 180, an exemplary sixteen-bit operand vector 190 is received by the shifter. A sixteen-bit scale 191 is shown in FIG. 8 to identify the various bit positions. The bit-field-location bits (not shown) instruct the shifter that a marker bit 192 is located in position seven of operand vector 190. The bit-field-width bits (not shown) instruct the shifter that there are four bits in a bit-field 194. In the example illustrated by FIG. 8, the bits in the three positions less significant than marker bit 192 are included in bit-field 194. This configuration, however, is not limiting, and other configurations are possible. Thus, bit-field 194 comprises the bits in positions four through seven of operand vector 190. In block 182, bit-field 194 is shifted to the position in operand vector 190 where it is aligned with the comparison unit. In this example, the desired position is the four least significant bits of operand vector 190. Thus, marker bit 192 is right shifted to position three (i.e., 7–4) so that the bits of bit-field 194 appear in the first four positions of a shifted vector 196. The other bits in shifted vector 196 are not of concern and are shown as "don't cares." In block 184, comparison unit 124 tests bit-field 194 for the presence of a pattern. In this example, a match is found and comparison unit 124 outputs a corresponding high value for the selection signal. In block 186, switching logic 112 receives the selection signal from comparison unit 124 and outputs a corresponding output vector 198. In this example, output vector 198 corresponds to operand vector 190 after being modified by a function unit that performed an increment operation on the operand vector.

Figure 9:
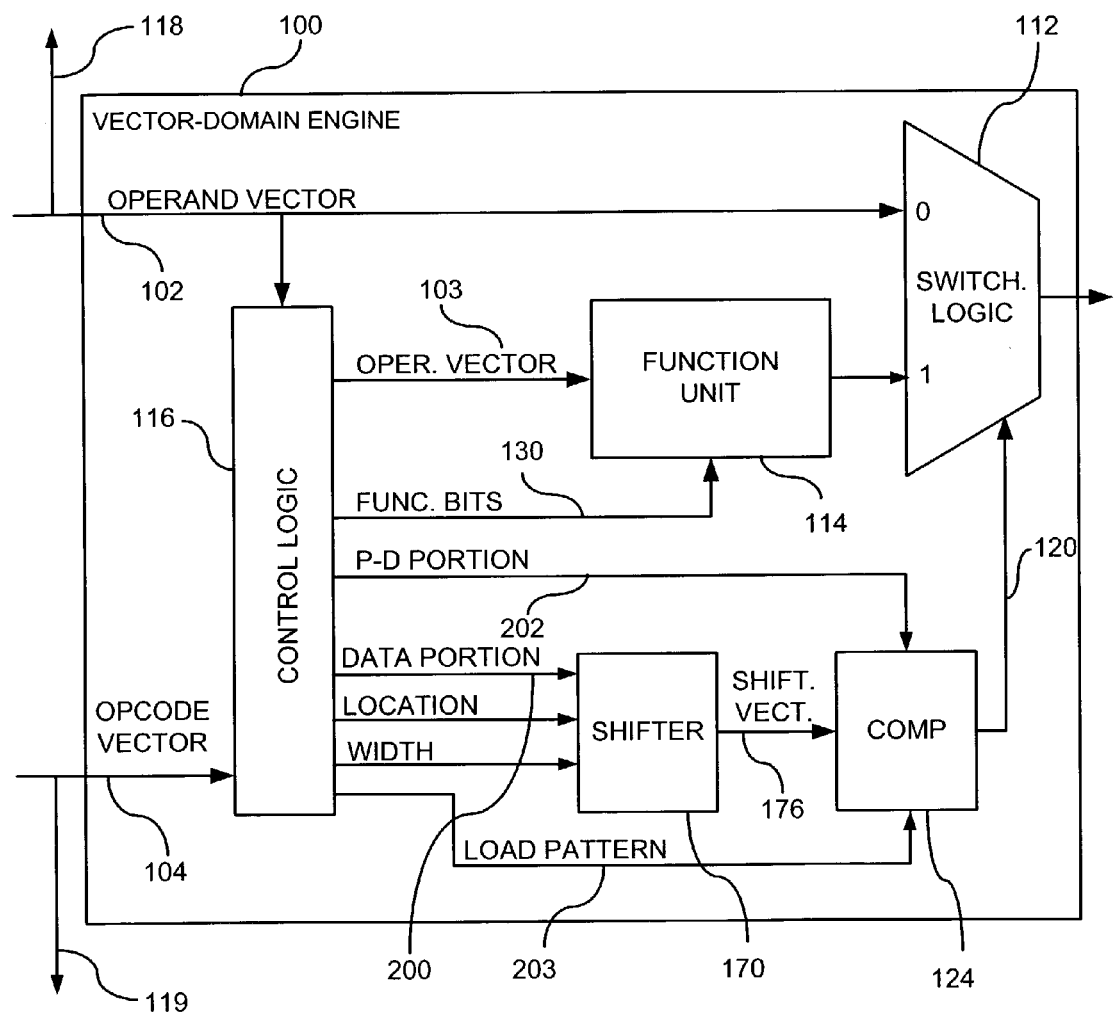
FIG. 9 shows a third representative embodiment of the vector-domain engine configured to perform conditional operations on an operand vector.
Figure 10:
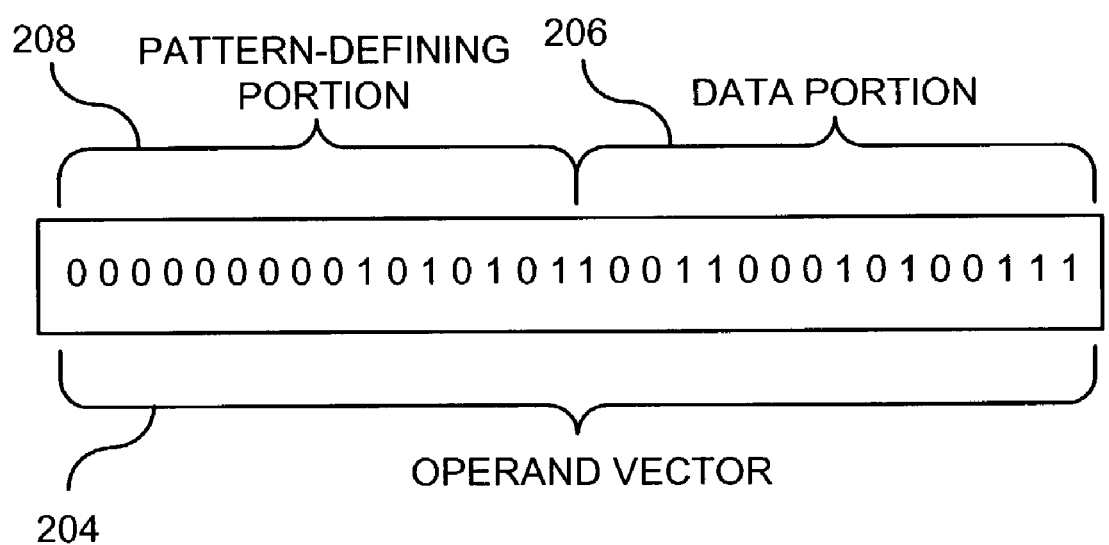
FIG. 10 shows an exemplary operand vector illustrating the principles of the third representative embodiment shown in FIG. 9.

FIGS. 9 and 10 show a third representative embodiment of vector-domain engine 100. The third representative embodiment is similar to the other embodiments, except that the operand vector includes a data portion and a pattern-defining portion. Thus, in contrast to the previous embodiments where the pattern-defining bits were included as part of the opcode vector or otherwise input into comparison unit 124, the pattern-defining bits of this embodiment are in a pattern-defining portion of the operand vector. Moreover, the pattern-defining portion and the data portion may be loaded simultaneously into comparison unit 124 on respective paths 202 and 200, respectively. Thus, a single operand vector may contain the pattern and the data to be matched for the pattern.

Turning briefly to FIG. 10, an operand vector 204 according to the principles of the third representative embodiment is shown. Operand vector 204 includes data portion 206, on which the operation is conditionally performed, and pattern-defining portion 208, which defines the pattern to be matched. In FIG. 10, operand vector 204 is thirty-two-bits wide and includes a sixteen-bit data portion 206 and a sixteen-bit pattern-defining portion 208. The particular configuration shown in FIG. 10, however, is not limiting, and multiple widths of the data portion and pattern-defining portion are possible.

Figure 12:
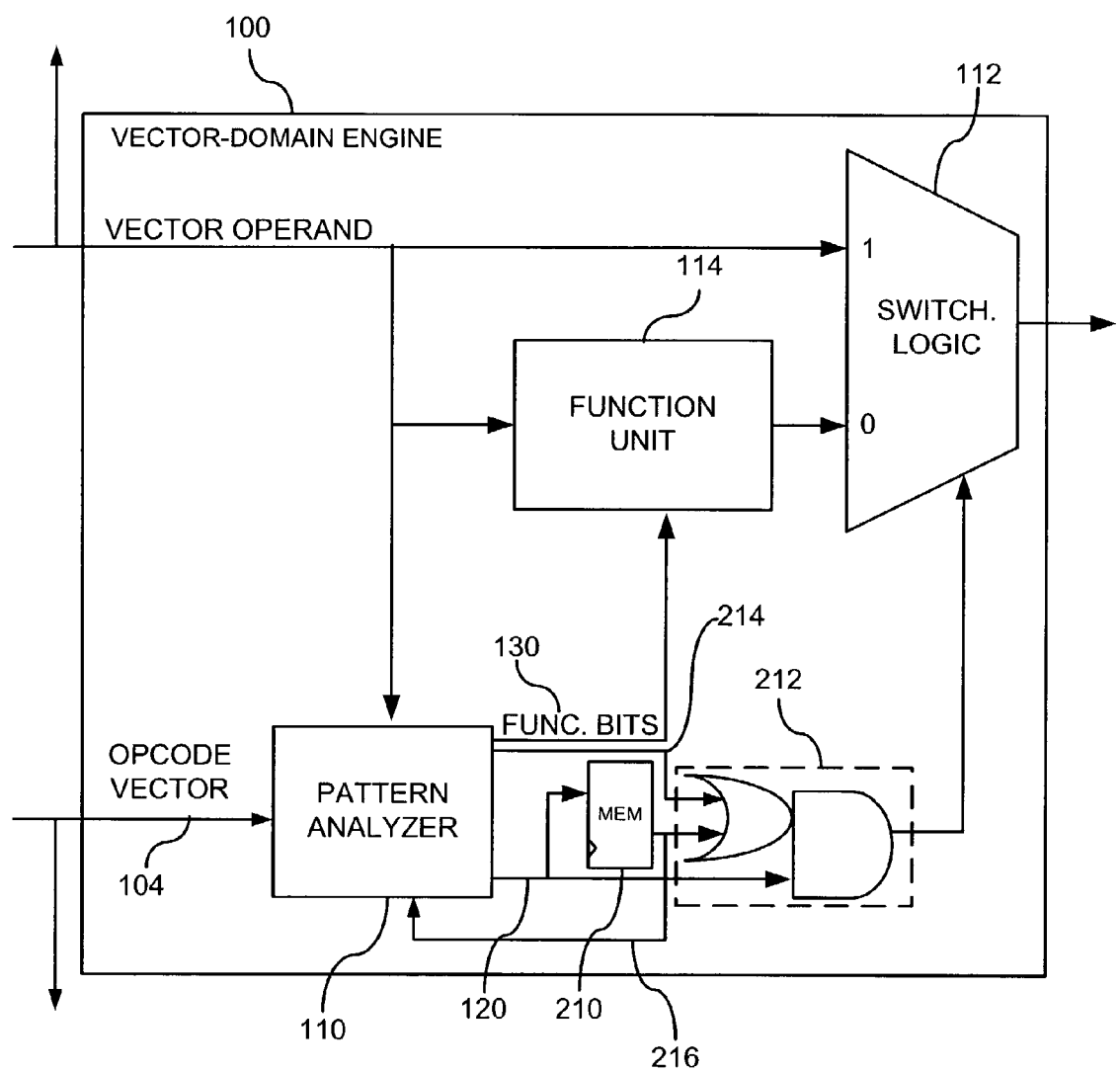
FIG. 12 shows a fifth representative embodiment of the vector-domain engine configured to perform conditional operations on an operand vector.

Returning to FIG. 9, control logic 116 is configured to route the operand vector to function unit 114 on path 103, where an operation is performed as instructed by the function-controlling bits on path 130. Additionally, control logic 116 routes the data portion of the operand vector to shifter 170 on path 200. Shifter 170 shifts the data portion such that the bit-field is aligned with comparison unit 124 in a shifted vector. The shifted vector is routed to comparison unit 124 on path 176. Although shifter 170 is shown in FIG. 9, the principles of this embodiment may be employed with any of the other embodiments discussed. Control logic 116 also routes the pattern-defining portion of the operand vector to comparison unit 124 on path 202, where the pattern-defining portion is used to define the pattern that is compared with the bit-field in order to determine the status of the selection signal on path 120. The pattern-defining portion may be loaded into comparison unit 124 on path 202 with each operand vector input into vector-domain engine 100. Alternatively, the pattern-defining portion may be loaded based on the status of an optional load pattern signal on path 203. The load pattern signal may be controlled by the opcode vector, as shown in FIG. 12, or by other control means (e.g., a control unit external to the vector-domain engine). Additionally, the operand vector may be routed to other vector-domain components via routing 118. Accordingly, various other operations may be performed on equivalent operand vectors controlled by other opcode vectors. For example, a second vector-domain engine may receive the same operand vector as a first vector-domain engine, but perform a different operation on the operand vector. Similarly, the opcode vector may be routed to other vector-domain components via routing 119. Accordingly, equivalent operations may be performed on different operand vectors. The operand vector is therefore distinct from the opcode vector.

Figure 11:
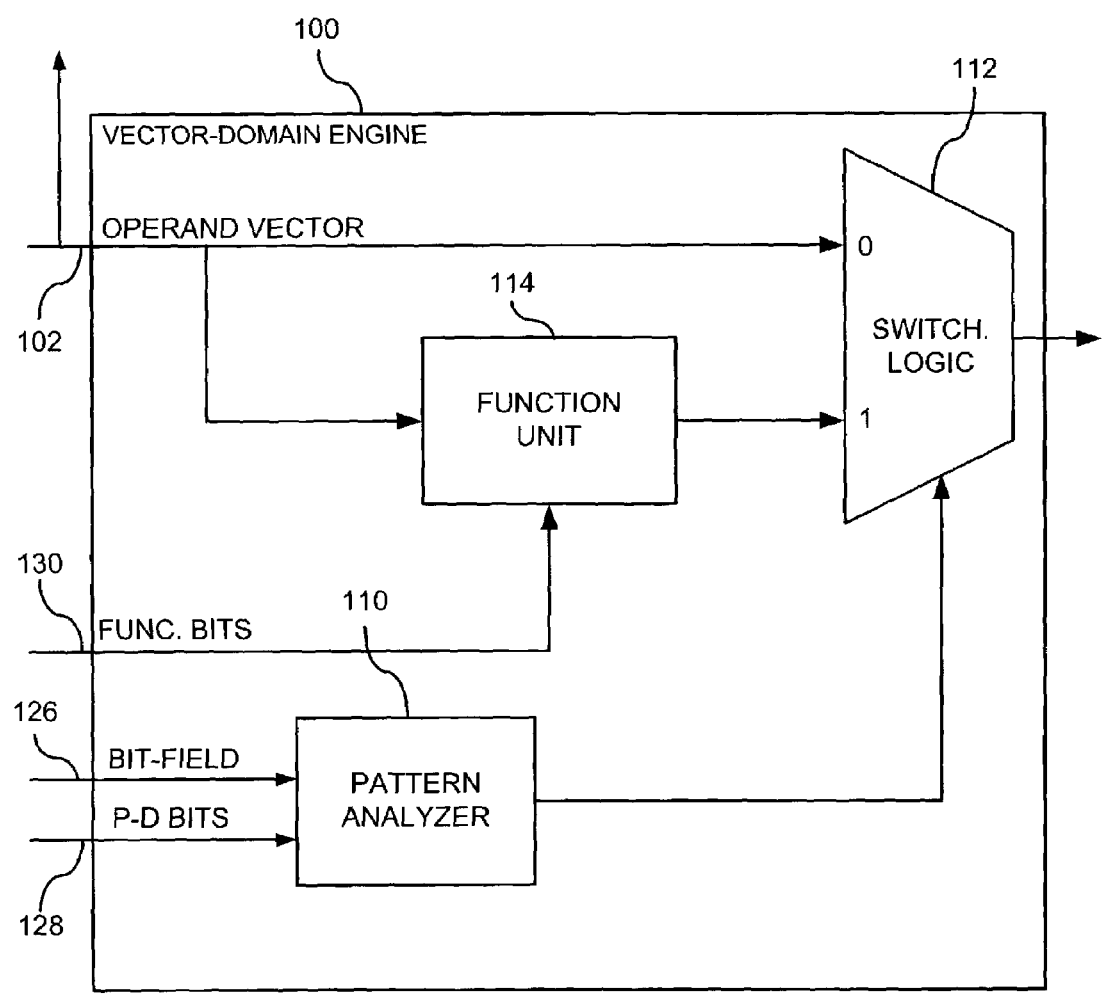
FIG. 11 shows a fourth representative embodiment of the vector-domain engine configured to perform conditional operations on an operand vector.

FIG. 11 shows a fourth representative embodiment of vector-domain engine 100. This embodiment is similar to the other embodiments, except that control logic 116 (not shown) is external to vector-domain engine 100. Thus, the opcode vector and the operand vector are decoded and routed outside of vector-domain engine 100. For example, as is shown in FIG. 11, the function-controlling bits on path 130 are input directly to function unit 114. Similarly, the pattern-defining bits on path 128 and the bit-field on path 126 are input directly to pattern analyzer 110. The particular configuration shown in FIG. 11 is not intended to be limiting in any way and various other configurations as described above are possible.

FIG. 12 shows a fifth representative embodiment of the vector-domain engine. This embodiment is similar to the other embodiments, except that it includes a memory unit 210 coupled with memory logic 212. In this embodiment, vector-domain engine 100 is configured to test a series of sequential operand vectors for the presence of a pattern before performing a specified logical or arithmetic function. If a match is found in each of the operand vectors, the function can be performed on the last operand vector in the series, the same operand vectors that were tested, or on another operand vector (or other operand vectors). Memory unit 210 is configured to receive and store the value of the selection signal on path 120 as determined by the previous operand vector processed by vector-domain engine 100. Memory unit 210 may comprise a D flip-flop or other memory element. Memory unit 210 is further coupled with memory logic 212. Memory logic 212 is configured to control switching logic 112 so that a designated output vector is output from the vector-domain engine 100 if memory unit 210 indicates that the bit-fields in a series of operand vectors match the pattern. Thus, the pattern can be matched in a series of operand vectors before a particular function is performed. Memory logic 212 may include a memory control signal on path 214, which originated from pattern analyzer 110 and is logically coupled with the output of memory unit 210 that is used to select whether the memory unit should store the current status of the selection signal. A memory status signal carried on path 216, which couples the output of memory unit 210 with pattern analyzer 110, may also be included so that pattern analyzer 110 can determine whether the pattern has been found in the designated number of operand vectors. The configuration in FIG. 12 is not intended to be limiting in any way and other configurations of memory elements and logic are possible.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

What is claimed is:

1. A vector-domain engine for performing a conditional operation in a programmable logic device, comprising:
   an input port to receive an operand vector;
   a function unit having an input coupled to the input port and an output that outputs a first output vector comprising the operand vector modified by a logical or arithmetic operation;
   a comparison unit having an input coupled to the input port and an output that outputs a selection signal based on whether a bit-field of the operand vector matches a pattern;
   a multiplexer having a selection input coupled to the comparison unit output, a first multiplexer input coupled to the function unit output, and a second multiplexer input coupled to the input port; and
   a shifter having an input coupled to at least the input port and having an output coupled to the comparison unit input, the shifter being configured to shift the bit-field of the operand vector and output a shifted vector to the comparison unit input.

2. The vector-domain engine of claim 1, wherein the input port also receives an opcode vector, the vector-domain engine further comprising control logic coupled to the input pot, the control logic being configured to decode the opcode vector and route portions of the opcode vector to the function unit input and the comparison unit input, the control logic being further configured to route the bit-field of the operand vector to the comparison unit input.

3. The vector-domain engine of claim 1, wherein the shifter is a barrel shifter.

4. The vector-domain engine of claim 1, wherein the operand vector comprises a pattern-defining portion and a data portion, the pattern-defining portion being used by the comparison unit to define the pattern.

5. The vector-domain engine of claim 4, wherein the pattern-defining portion is loaded into the vector-domain engine simultaneously with the data portion.

6. The vector-domain engine of claim 1, wherein a single instruction is used to perform the conditional operation.

7. The vector-domain engine of claim 1, wherein the comparison unit comprises a look-up table.

8. The vector-domain engine of claim 1, wherein the function unit performs one or more of the following logical or arithmetic operations:
  (a) absolute value;
  (b) increment;
  (c) decrement;
  (d) invert;
  (e) negate; and
  (f) round.

9. The vector-domain engine of claim 1, wherein the function unit comprises a half-adder.

10. A vector-domain engine for performing a conditional operation in a programmable logic device, comprising:
  an input port to receive an operand vector;
  a function unit having an input coupled to the input port and an output that outputs a first output vector comprising the operand vector modified by a logical or arithmetic operation;
  a comparison unit having an input coupled to the input port and an output that outputs a selection signal based on whether a bit-field of the operand vector matches a pattern;
  a multiplexer having a selection input coupled to the comparison unit output, a first multiplexer input coupled to the function unit output, and a second multiplexer input coupled to the input port; and
  a memory unit having an input coupled to the comparison unit output, the memory unit being configured to store whether the bit-field of the operand vector matches the pattern, the comparison unit and the multiplexer being further configured to output from the engine the first output vector if the pattern is matched in a predetermined number of sequential operand vectors.

11. A programmable logic device, comprising:
  multiple configurable logic blocks; and
  at least one vector-domain engine coupled to the multiple configurable logic blocks and configured to receive an operand vector, the vector-domain engine being configured to perform a conditional operation on the operand vector if a bit-field of the operand vector matches a pattern,
  wherein the vector-domain engine includes an input port to receive the operand vector and further comprises a shifter coupled to the input port, the shifter being configured ti shift the bit-field of the operand vector and output a shifted vector to a pattern analyzer.

12. The device of claim 11, wherein the vector-domain engine comprises switching logic configured to output a modified vector if the bit-field of the operand vector matches the pattern.

13. The device of claim 12, wherein the switching logic is further configured to output the operand vector unmodified if the bit-field of the operand vector does not match the pattern.

14. The device of claim 11, wherein the vector-domain engine includes an input port to receive the operand vector and further comprises a pattern analyzer coupled to the input port, the pattern analyzer being configured to output a selection signal to a switching logic, the selection signal indicating whether the bit-field of the operand vector matches the pattern.

15. The device of claim 11, wherein the vector-domain engine includes an input port to receive the operand vector and an opcode vector, the vector-domain engine further comprising control logic coupled to the input port, the control logic being configured to decode and route portions of the opcode vector and to route the bit-field of the operand vector.

16. The device of claim 11, wherein the operand vector comprises a pattern-defining portion and a data portion, the pattern-defining portion being used to define the pattern.

17. The device of claim 16, wherein the pattern-defining portion is loaded into the vector-domain engine simultaneously with the data portion.

18. The device of claim 11, wherein a single instruction is used to perform the conditional operation.

19. A programmable logic device, comprising:
  multiple configurable logic blocks; and
  at least one vector-domain engine coupled to the multiple configurable logic blocks and configured to receive an operand vector, the vector-domain engine being configured to perform a conditional operation on the operand vector if a bit-field of the operand vector matches a pattern,
  wherein the vector-domain engine further comprises:
  a memory unit;
  memory logic coupled to the memory unit, the memory unit and memory logic being configured to store whether the bit-field of the operand vector matches the pattern; and
  switching logic coupled to the memory unit and the memory logic, the switching logic being configured to output a modified vector if the memory unit and the memory logic indicate that the pattern has been matched in a predetermined number of sequential operand vectors.

20. A method for performing a conditional operation in a programmable logic device, comprising:
  receiving an instruction comprising an operand vector and an opcode vector;
  determining whether a bit-field of the operand vector matches a pattern, wherein the determining comprises:
    shifting the bit-field of the operand vector to create a shifted vector; and
    comparing the shifted vector to the pattern; and
  outputting either a first output vector if the bit-field of the operand vector matches the pattern or a second output vector if the bit-field of the operand vector does not match the pattern.

21. The method of claim 20, wherein the instruction is transmitted from a programmable-logic-device domain.

22. The method of claim 20, wherein the first output vector or the second output vector is output to a programmable-logic-device domain.

23. The method of claim 20, wherein the first output vector is the operand vector modified by a function unit, which performs a logical or arithmetic operation on the operand vector.

24. The method of claim 20, wherein the second output vector is the operand vector unmodified.

25. The method of claim 20, wherein the operand vector comprises a pattern-defining portion and a data portion, the pattern-defining portion being used to define the pattern.

26. The method of claim 25, wherein the pattern-defining portion is loaded into the vector-domain engine simultaneously with the data portion.

27. The method of claim 20, wherein the instruction is a single instruction, and wherein the receiving is performed by a first vector-domain engine and the operand vector is received by a second vector-domain engine at substantially the same time.

28. The method of claim 20, wherein the instruction is a single instruction, and wherein the receiving is performed by a first vector-domain engine and the opcode vector is received by a second vector-domain engine at substantially the same time.

29. A method for performing a conditional operation in a programmable logic device, comprising:
   receiving an instruction comprising an operand vector and an opcode vector;
   determining whether a bit-field of the operand vector matches a pattern;
   outputting either a first output vector if the bit-field of the operand vector matches the pattern or a second output vector if the bit-field of the operand vector does not match the pattern; and
   storing whether the bit-field of the operand vector matches the pattern, and wherein the first output vector is output if the pattern is matched in a predetermined number of sequential operand vectors.

30. A vector-domain engine for performing a conditional operation in a programmable logic device, comprising:
   means for receiving an operand vector;
   means for determining whether a bit-field of the operand vector matches a pattern;
   means for performing a logical or arithmetic operation on the operand vector to create a first output vector; and
   means for outputting the first output vector if the operand vector matches the pattern; and
   means for storing whether the bit-field of the operand vector matches the pattern, the means for outputting being configured to output the first output vector if the pattern is matched in a predetermined number of sequential operand vectors.

31. The vector-domain engine of claim 30, further comprising a means for shifting the bit-field of the operand vector.

32. The vector-domain engine of claim 30, wherein the operand vector comprises a pattern-defining portion and a data portion, the pattern-defining portion being used by the means for determining to define a pattern and to determine whether a bit-field of the operand vector matches the pattern.

33. The vector-domain engine of claim 30, wherein the means for receiving also receives an opcode vector, and a single instruction comprising the operand vector and the opcode vector is used to perform the conditional operation.

34. The vector-domain engine of claim 33, further comprising:
   means for decoding and routing portions of the opcode vector to the means for performing and the means for determining; and
   means for routing the bit-field of the operand vector to the means for determining.

* * * * *